US012772793B2

(12) United States Patent
Ueda

(10) Patent No.: US 12,772,793 B2
(45) Date of Patent: Oct. 20, 2026

(54) ELECTROSTATIC CHUCK AND MANUFACTURING METHOD THEREOF

(71) Applicant: Sodick Co., Ltd., Kanagawa (JP)

(72) Inventor: Toshiyuki Ueda, Kanagawa (JP)

(73) Assignee: Sodick Co., Ltd., Kanagawa (JP)

( * ) Notice: Subject to any disclaimer, the term of this patent is extended or adjusted under 35 U.S.C. 154(b) by 170 days.

(21) Appl. No.: 18/798,738

(22) Filed: Aug. 8, 2024

(65) Prior Publication Data

US 2025/0140593 A1 May 1, 2025

(30) Foreign Application Priority Data

Oct. 30, 2023 (JP) ................................ 2023-185335

(51) Int. Cl.
*H10P 72/72* (2026.01)

(52) U.S. Cl.
CPC .................................. *H10P 72/722* (2026.01)

(58) Field of Classification Search
CPC .. H10P 72/0434; H10P 72/0602; H10P 72/72; H10P 72/722
USPC .......................................................... 361/234
See application file for complete search history.

(56) References Cited

U.S. PATENT DOCUMENTS

2011/0005686 A1* 1/2011 Tanaka ................ H10P 72/7616 156/345.52
2018/0096870 A1* 4/2018 Yoshida .............. H10P 72/0602
2018/0321088 A1* 11/2018 Martinez .................. G01K 1/08

FOREIGN PATENT DOCUMENTS

JP 2000286331 10/2000
KR 20230141108 A * 10/2023 .......... H10P 72/0602

OTHER PUBLICATIONS

Machine translation of Kim Korean Patent Document KR 20230141108 A Oct. 2023 (Year: 2023).*

* cited by examiner

*Primary Examiner* — Kevin J Comber
(74) *Attorney, Agent, or Firm* — JCIPRNET

(57) ABSTRACT

An electrostatic chuck includes a substrate, a bush, an attraction electrode, a dielectric layer, and a temperature adjuster. The substrate includes a first surface having electrical insulation properties and a second surface, and has a through hole formed therein that penetrates the first surface and the second surface. The bush is a bottomed cylindrical body inserted into the through hole, and is configured so that a temperature sensor for measuring a temperature of the bottom plate is capable of being attached thereto. The attraction electrode is formed on the first surface and is made of an electric conductor. The dielectric layer is formed so as to cover the bush and the attraction electrode, and is configured to be capable of attracting a workpiece. The temperature adjuster is configured to be capable of adjusting a temperature of the workpiece.

18 Claims, 8 Drawing Sheets

ELECTROSTATIC CHUCK AND MANUFACTURING METHOD THEREOF

CROSS-REFERENCE TO RELATED APPLICATION

This application claims the priority benefits of Japanese application No. 2023-185335, filed on Oct. 30, 2023. The entirety of the above-mentioned patent application is hereby incorporated by reference herein and made a part of this specification.

BACKGROUND

Technical Field

The disclosure relates to an electrostatic chuck and a manufacturing method of an electrostatic chuck.

Description of Related Art

An electrostatic chuck is a gripping device that attracts and holds a workpiece by electrical attraction force such as Coulomb force, Johnsen-Rahbek force, or gradient force, which occurs when a voltage is applied to an attraction electrode installed internally.

The electrostatic chuck includes a substrate, an attraction electrode formed on the substrate, and a dielectric layer covering the attraction electrode, and attracts the workpiece by the electrical attraction force generated in the dielectric layer when a voltage is applied to the attraction electrode. Hereinafter, a surface of the substrate on which the attraction electrode is formed will be referred to as a first surface, and a surface opposite to the first surface will be referred to as a second surface. In addition, the surface that is in direct contact with the dielectric layer of the workpiece is referred to as an attracted surface, and the surface opposite to the attracted surface is referred to as a non-attracted surface.

In an electrostatic chuck, a temperature adjuster is sometimes provided to adjust the temperature of the workpiece. At this time, it is preferable to measure the temperature of the workpiece by a temperature sensor and use the measured temperature for feedback control or the like.

It is difficult to directly measure the temperature of a workpiece for the following reasons. When measuring the non-attracted surface of a workpiece, it is not preferable to use a contact temperature sensor in order to prevent scratching or contamination of the workpiece. Furthermore, in order to use a non-contact temperature sensor, it is needed that there are no obstacles between the non-contact temperature sensor and the workpiece, which complicates the design. Furthermore, when the electrostatic chuck is used in a vacuum, the non-contact temperature sensor needs to be pressure-resistant, which increases the manufacturing cost. When measuring the attracted surface of the workpiece, a through hole is provided through the substrate and the dielectric layer, and a temperature sensor is placed in the through hole to measure the attracted surface. At this time, the efficiency of heat transfer between the temperature adjuster and the periphery of the through hole decreases, so that temperature unevenness is likely to occur in the workpiece.

For this reason, conventionally, a bottomed hole is formed on the second surface side of the substrate, and the temperature of the bottom surface of the bottomed hole is measured, thereby indirectly measuring the temperature of the workpiece. Japanese Patent Application Laid-open Publication No. 2000-286331 discloses an electrostatic chuck in which a thermocouple is embedded in a plate-shaped ceramic body. At this time, since an error may occur between the temperature acquired by the temperature sensor and the actual temperature of the workpiece, a predetermined offset value is added to the measured temperature to be regarded as the actual temperature of the workpiece.

It is not easy to determine an appropriate offset value because the appropriate value can change depending on various conditions, such as the environment around the electrostatic chuck and the temperature before the workpiece is attracted.

If the distance between the bottom surface of the bottomed hole and the first surface of the substrate can be reduced, the distance between the temperature measurement position and the workpiece is also reduced, thereby reducing the measurement error. However, since the provision of a thin-walled portion in the substrate may cause cracks, there is a design limit to how small the distance between the bottom surface of the bottomed hole and the first surface of the substrate can be.

The disclosure provides an electrostatic chuck and a manufacturing method thereof that can reduce a measurement error relatively when measuring the temperature of a workpiece.

SUMMARY

The disclosure provides an electrostatic chuck. The electrostatic chuck includes: a substrate which includes a first surface having electrical insulation properties and a second surface opposite to the first surface, and has a through hole formed therein that penetrates the first surface and the second surface; a bush, a bottomed cylindrical body including a side wall, an opening formed at one end of the side wall, and a bottom plate provided at the other end of the side wall, which is inserted through the through hole so that the opening is located on a side near the second surface and the bottom plate is located on a side near the first surface, and is configured so that a temperature sensor for measuring a temperature of the bottom plate is capable of being attached thereto; an attraction electrode which is formed on the first surface and made of an electric conductor; a dielectric layer, made of a dielectric, which is formed so as to cover the bush and the attraction electrode and is configured to be capable of attracting a workpiece; and a temperature adjuster which is configured to be capable of adjusting a temperature of the workpiece.

In addition, the disclosure provides a manufacturing method of an electrostatic chuck. The manufacturing method of an electrostatic chuck includes: a substrate preparation step of preparing a substrate which includes a first surface having electrical insulation properties and a second surface opposite to the first surface and has a through hole formed therein that penetrates the first surface and the second surface; a bush insertion step of inserting a bush which is a bottomed cylindrical body including a side wall, an opening formed at one end of the side wall, and a bottom plate provided at the other end of the side wall, and is configured so that a temperature sensor for measuring a temperature of the bottom plate is capable of being attached thereto into the through hole so that the opening is located on a side near the second surface and the bottom plate is located on a side near the first surface; an attraction electrode forming step of forming an attraction electrode made of an electric conductor on the first surface; a dielectric layer forming step of forming a dielectric layer made of a dielectric configured to be capable of attracting a workpiece so as to cover the attraction electrode and the bush; and a temperature adjuster installation step of installing a temperature adjuster configured to be capable of adjusting a temperature of the workpiece.

DESCRIPTION OF THE EMBODIMENTS

Figure 1:
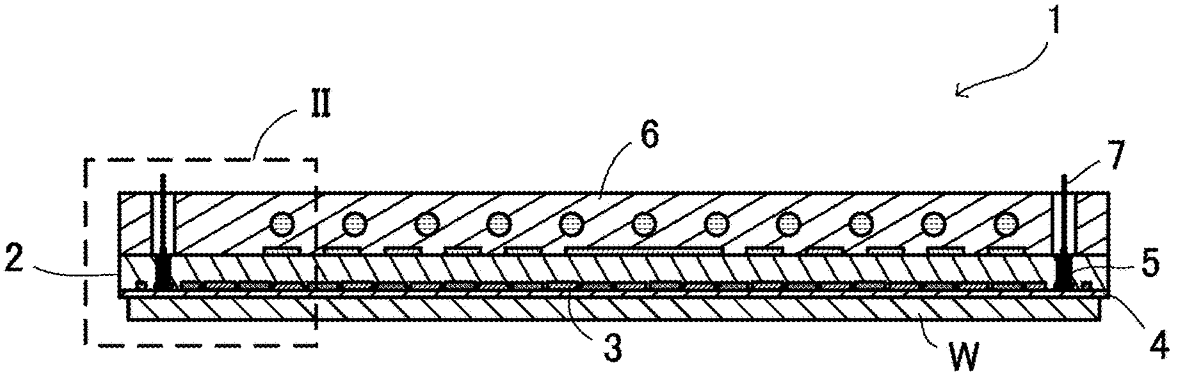
FIG. 1 is a cross-sectional view of an electrostatic chuck.

In the electrostatic chuck according to the disclosure, the through hole is formed in the substrate, and the bush which is a bottomed cylindrical body is inserted into the through hole. The dielectric layer is then formed to cover the attraction electrode and the bush. To measure the temperature of the workpiece, the temperature sensor is attached to the bush and measures the temperature of the bottom plate of the bush. According to such a configuration, since the distance between the temperature measurement position and the workpiece may be designed to be relatively small, an electrostatic chuck can be realized in which the temperature measurement error is relatively reduced.

Hereinafter, an embodiment of the disclosure will be described with reference to the drawings. In each of the drawings, each of components is shown roughly, and the shape and scale are not necessarily as shown in the drawing. The various modified examples described below can be implemented in any combination.

An electrostatic chuck 1 of the embodiment can be suitably used as a wafer gripping device in a vacuum chamber of a semiconductor manufacturing device. However, the application field of the electrostatic chuck 1 is not limited thereto.

Also, the electrostatic chuck 1 of the embodiment can be particularly suitably used when a workpiece W to be attracted is made of a material such as glass that has low thermal conductivity and is prone to temperature unevenness. Specifically, it is particularly suitable when the thermal conductivity of the workpiece W (at room temperature, i.e., at about 5° C. to 30° C.) is 3.0 W/m·K or less.

Figure 2:
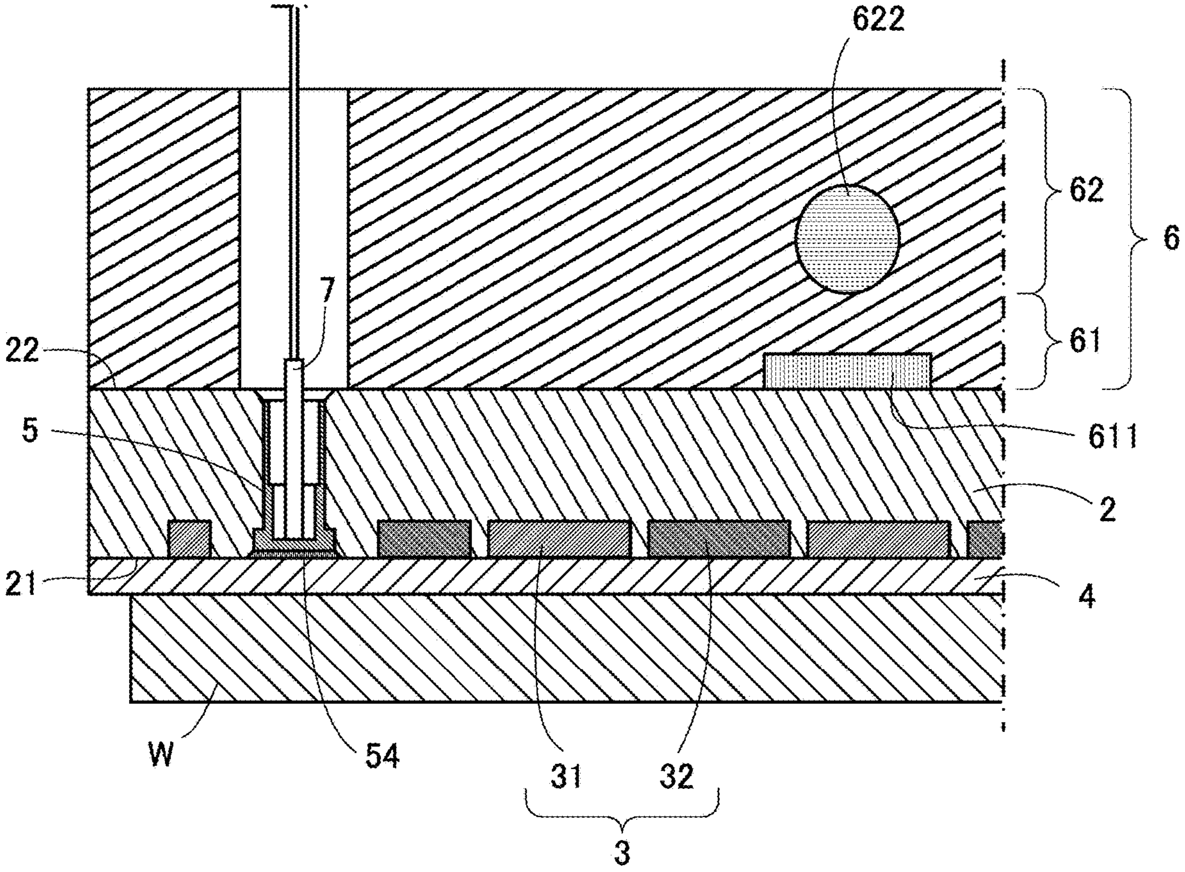
FIG. 2 is an enlarged view of a region II in FIG. 1.

As shown in FIGS. 1 and 2, the electrostatic chuck 1 of the embodiment includes a substrate 2, an attraction electrode 3, a dielectric layer 4, a bush 5, a temperature adjuster 6, and a temperature sensor 7.

The substrate 2 is a plate-shaped base material on which the attraction electrode 3 and the dielectric layer 4 are formed. The substrate 2 includes a first surface 21 and a second surface 22 that is the surface opposite to the first surface 21. The first surface 21 is the surface on which the attraction electrode 3 and the dielectric layer 4 are formed, and has electrical insulation properties. The substrate 2 of the embodiment is specifically an integrally formed sintered ceramic body, and has the above-mentioned insulation properties as a whole, but the substrate 2 may be made of a composite material, as long as at least the first surface 21 has electrical insulation properties. The substrate 2 has a through hole 23 formed therein, which passes through the first surface 21 and the second surface 22 in a plate thickness direction, and the bush 5 is inserted into the through hole 23.

The electrostatic chuck 1 of the embodiment can be particularly suitably used in the case where the substrate 2 is made of a material that is prone to cracking when a thin-walled portion is provided thereon. Specifically, it is particularly suitable that the substrate 2 is made of ceramic or glass. As the ceramic, for example, alumina may be used.

Figure 3:
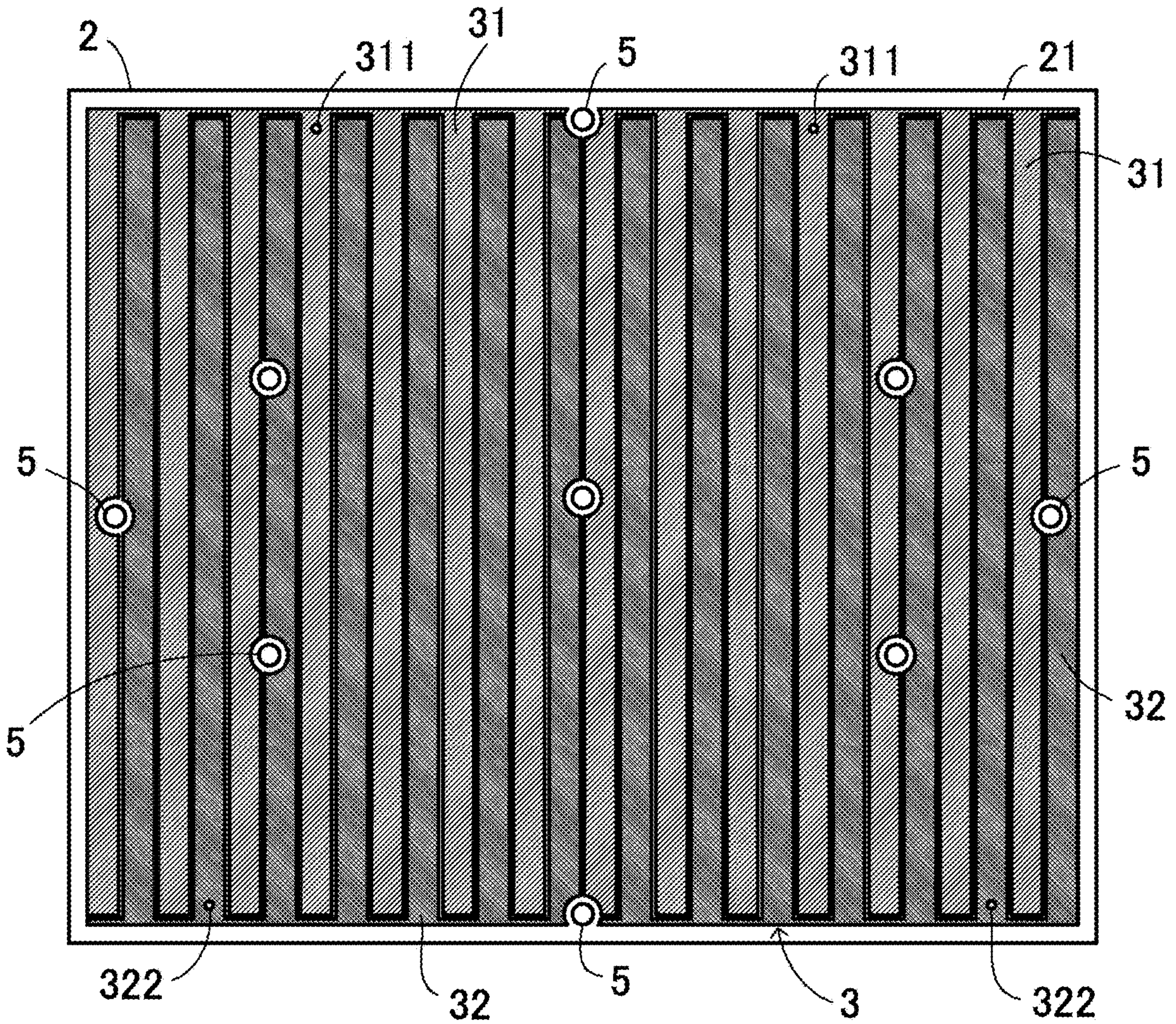
FIG. 3 is a bottom view of a substrate having an attraction electrode formed on a first surface thereof.

The attraction electrode 3 is an electrode formed on the first surface 21 of the substrate 2 and made of an electric conductor. The attraction electrode 3 may be a monopolar type having merely one of a positive electrode 31 and a negative electrode 32, or a bipolar type having both the positive electrode 31 and the negative electrode 32. The attraction electrode 3 of the embodiment is of a bipolar type, and as shown in FIG. 3, has a so-called comb-tooth shape in which the positive electrodes 31 and the negative electrodes 32 are alternately disposed with a predetermined gap therebetween. When the workpiece W is attracted, a predetermined voltage is applied to the positive electrode 31 and the negative electrode 32 via a terminal 311 and a terminal 322, respectively.

The material of the attraction electrode 3 is not particularly limited as long as the material can be used as an electrode. However, when the attraction electrode 3 is made of the same material as a filled layer 54 described later, it is preferable that the material have high thermal conductivity. The attraction electrode 3 may be made of, for example, aluminum, copper, silver, nickel, tungsten, or an alloy containing the aforementioned as main components.

The dielectric layer 4 is a layer made of a dielectric that is formed so as to cover the bush 5 and the attraction electrode 3. The dielectric layer 4 is configured to be capable of attracting the workpiece W, and the workpiece W is held in direct contact with the dielectric layer 4. In particular, when a predetermined voltage is applied to the attraction electrode 3, electrical attraction force such as Coulomb force, Johnsen-Rahbek force, gradient force is generated within the dielectric layer 4, and the workpiece W is attracted.

The material of the dielectric layer 4 is selected from any dielectric depending on the desired electrical resistivity. The dielectric layer 4 may be composed of, for example, zircon, alumina, zirconia, titania, aluminum nitride, silica, and mixtures thereof. The thickness of the dielectric layer 4 is, for example, about 0.2 mm or more and about 0.5 mm or less.

Figure 4:
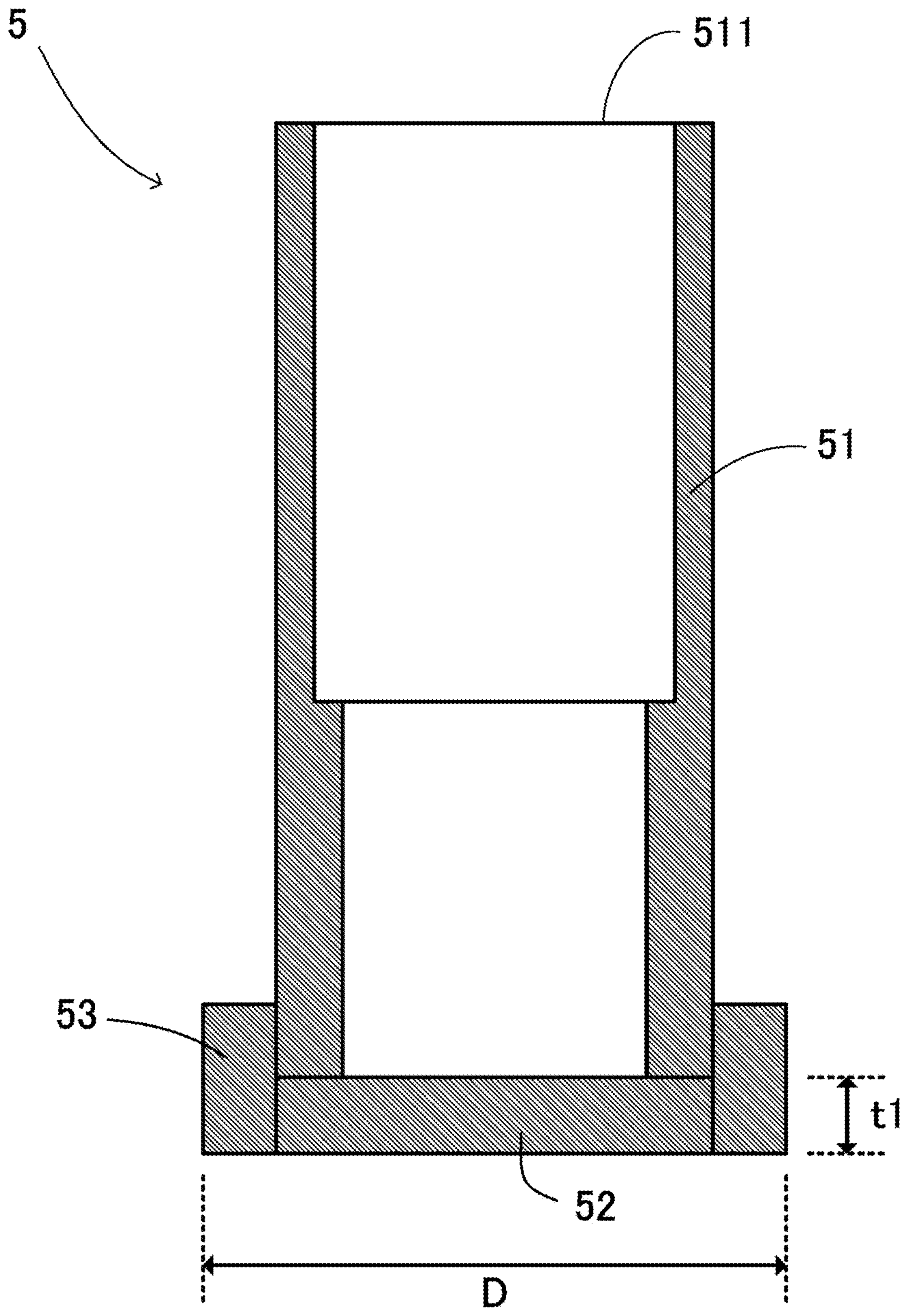
FIG. 4 is an enlarged cross-sectional view of a bush.

The bush 5 is a bottomed cylindrical body configured so that the temperature sensor 7 can be attached thereto. As shown in FIG. 4, the bush 5 includes a side wall 51, a bottom plate 52, and a flange 53. An opening 511 is formed at one end of the side wall 51, and the bottom plate 52 is provided at the other end of the side wall 51. As shown in FIG. 2, the bush 5 is inserted into the through hole 23 of the substrate 2 so that the opening 511 is located on a side near the second surface 22 and the bottom plate 52 is located on a side near the first surface 21. The temperature sensor 7 is inserted into the side wall 51 through the opening 511 in order to grasp the temperature of the workpiece W, and measures the temperature of the bottom plate 52. According to such a configuration, the temperature may be measured at a position closer to the workpiece W without providing a thin-walled portion in the substrate 2, and temperature measurement errors may further be reduced.

The material of the bush 5 is not particularly limited, but is preferably one having good thermal conductivity. The bush 5 may be made of, for example, metals such as aluminum, stainless steel, iron, and alloys containing the aforementioned as main components, machinable ceramics, and alumina. In particular, aluminum (including aluminum alloys) is preferable as the material for the bush 5 because aluminum has excellent thermal conductivity, workability, and availability.

It is preferable that a thickness t1 of the bottom plate 52 of the bush 5 be as small as possible in order to bring the temperature measurement position and the workpiece W closer to each other. The thickness t1 of the bottom plate 52 is, for example, about 3 mm or less. The lower limit of the thickness t1 of the bottom plate 52 is not particularly limited, but approximately 0.5 mm is a general processing limit.

The flange 53 is a brim portion formed on the periphery of the bottom plate 52. By providing the flange 53, the area over which the temperature is measured by the temperature sensor 7 can be substantially increased. Furthermore, the bush 5 may be prevented from falling off during manufacturing. On the other hand, when the bush 5 is made of an electric conductor, the bush 5 and the attraction electrode 3 need to be provided in a non-contact state. In designing the bush 5 so as not to come into contact with the attraction electrode 3, if the area of the flange 53 is large, such a case reduces the area in which the attraction electrode 3 can be formed, which may affect the attraction force of the electrostatic chuck 1. In view of the above, it is preferable that the area of the flange 53 be large enough to improve the accuracy of temperature measurement without affecting the attraction force, and a diameter D of the flange 53 is, for example, about 8 mm or more and about 10 mm or less.

As shown in FIG. 2, the filled layer 54 may be formed between the bottom plate 52 of the bush 5 and the dielectric layer 4. The reason of providing the filled layer 54 will be described later.

The temperature adjuster 6 is a device configured to be capable of adjusting the temperature of the workpiece W. The temperature adjuster 6 preferably performs feedback control using the temperature of the workpiece W measured by the temperature sensor 7. The temperature adjuster 6 includes at least one of a heater 61 for heating the workpiece W and a cooler 62 for cooling the workpiece W. In the embodiment, the temperature adjuster 6 is provided adjacent to the second surface of the substrate 2, but at least a part of the temperature adjuster 6 may be provided inside the substrate 2.

Figure 5:
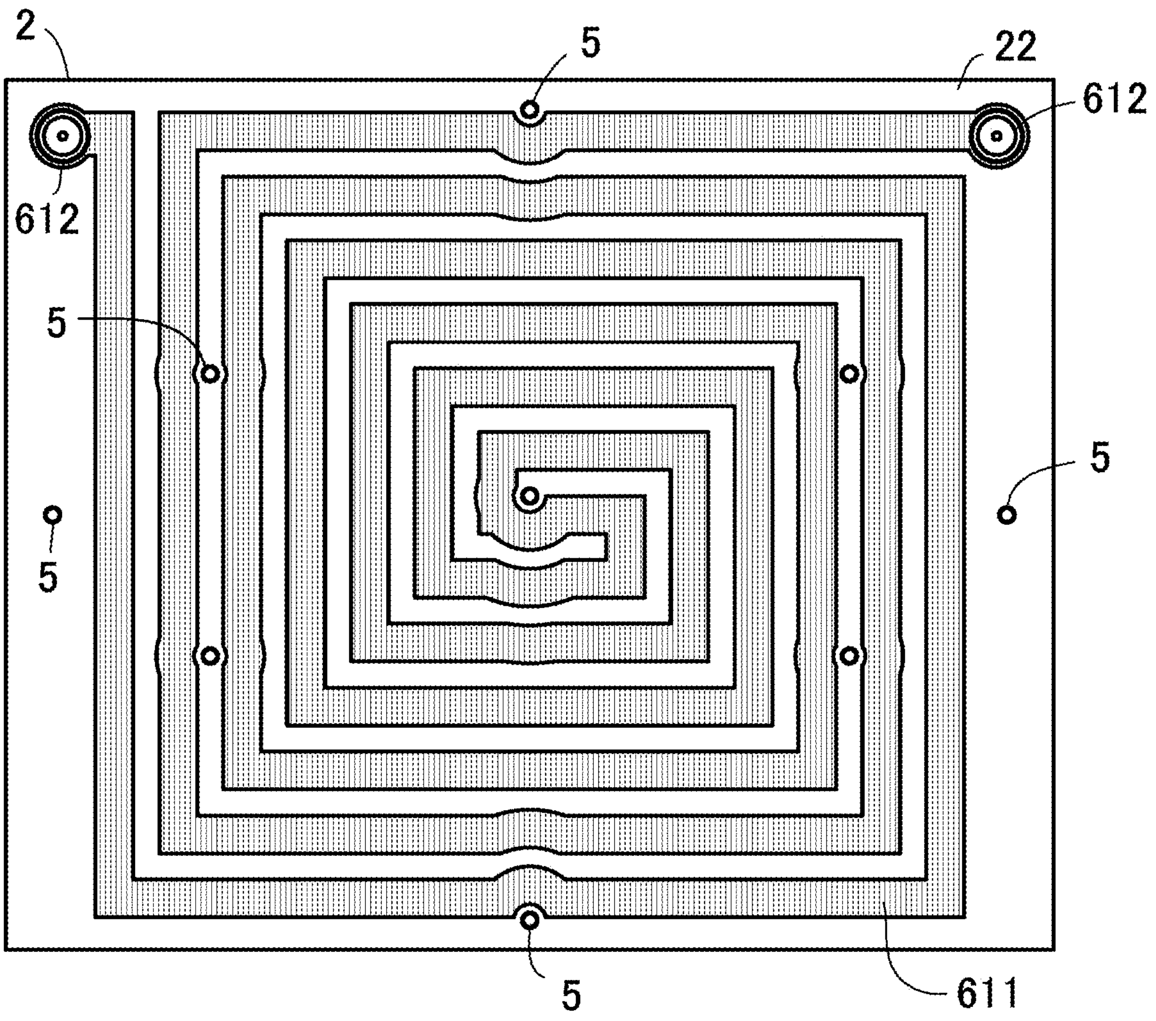
FIG. 5 is a top view of a substrate having a heater electrode formed on a second surface thereof.
Figure 6:
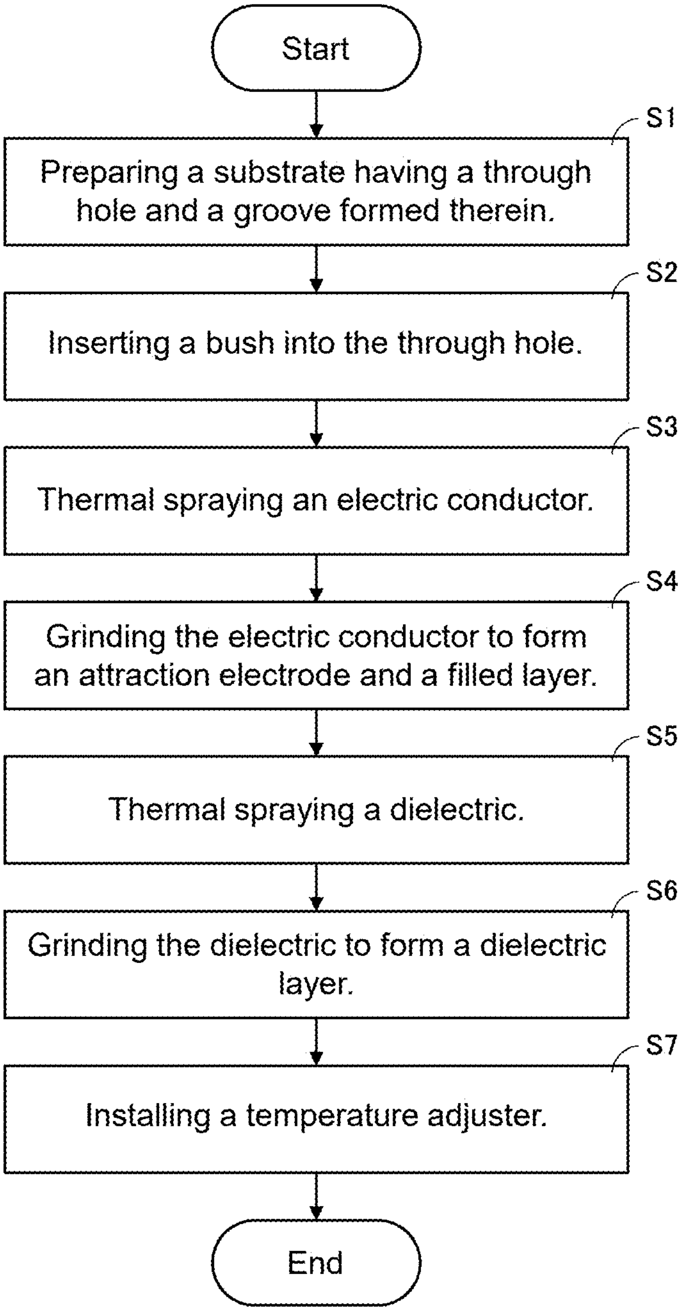
FIG. 6 is a flowchart illustrating a manufacturing method of an electrostatic chuck.

The heater 61 in the embodiment has a heater electrode 611. The heater electrode 611 is an electrode made of a resistive heating element. The resistive heating element may be, for example, Nichrome (i.e., nickel chrome alloy). In the embodiment, as shown in FIG. 5, the heater electrode 611 is formed directly on the second surface 22 of the substrate 2. Therefore, the second surface 22 needs to have electrical insulation properties. When the workpiece W is heated, a predetermined voltage is applied to the heater electrode 611 via a terminal 612.

The heater 61 is not limited to having the heater electrode 611. For example, the heater 61 may have a heating pipe that is a pipe through which a heating medium can flow, a sheath heater, or a sheet heater such as a polyimide heater or a polyester heater.

The cooler 62 in the embodiment has a cooling pipe 622. The cooling pipe 622 is a pipe through which air or a cooling medium can flow. The cooler 62 is not limited to having the cooling pipe 622. For example, the cooler 62 may include a Peltier element.

The temperature sensor 7 indirectly obtains the temperature of the workpiece W by measuring the temperature of the bottom plate 52 of the bush 5. The temperature sensor 7 is preferably a contact temperature sensor. More specifically, the temperature sensor 7 may be, for example, a thermocouple, a resistance temperature detector, or a thermistor. The positions and the number of the temperature sensors 7 and the bushes 5 through which the temperature sensors 7 are inserted are not particularly limited, but in order to measure the temperature of the workpiece W more accurately, it is preferable to provide multiple temperature sensors 7 and bushes 5 distributed over the entire surface of the electrostatic chuck 1. The electrostatic chuck 1 of the embodiment includes nine temperature sensors 7 and bushes 5.

Hereinafter, a manufacturing method of the electrostatic chuck 1 of the embodiment will be described with reference to FIGS. 6 to 12. In FIGS. 7 to 12, the configuration of the electrostatic chuck 1 is shown in a particularly simplified manner.

Figure 7:
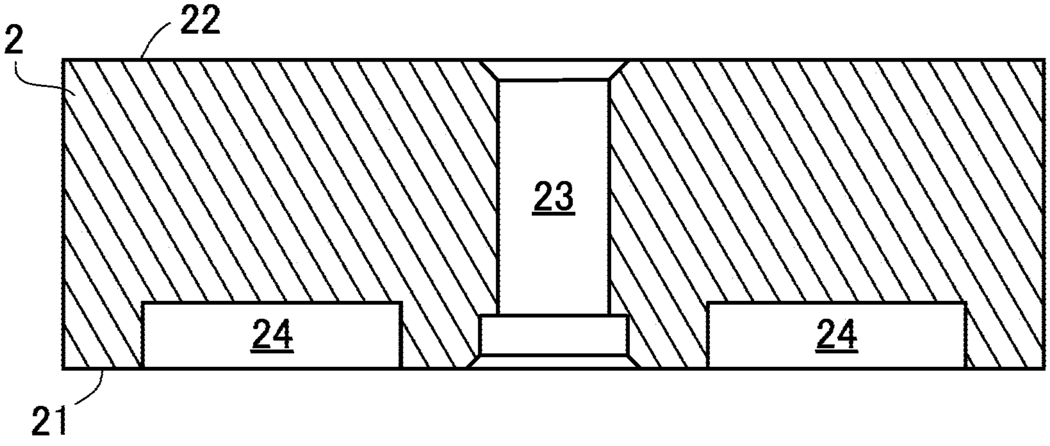
FIG. 7 is a descriptive drawing of the manufacturing method of an electrostatic chuck, showing a substrate in which a groove and a through hole are formed.

First, a substrate preparation step is carried out to prepare a substrate 2 (S1). As shown in FIG. 7, the substrate 2 has the through hole 23 formed therein that penetrates the first surface 21 and the second surface 22, and a groove 24 formed in the first surface 21. The through hole 23 has a first portion having a diameter substantially equal to an outer diameter of the side wall 51 of the bush 5, and a second portion having a diameter substantially equal to an outer diameter of the flange 53 of the bush 5, the first portion is located on the side near the second surface 22, and the second portion is located on the side near the first surface 21. The groove 24 has the same shape as the attraction electrode 3 to be formed.

Figure 8:
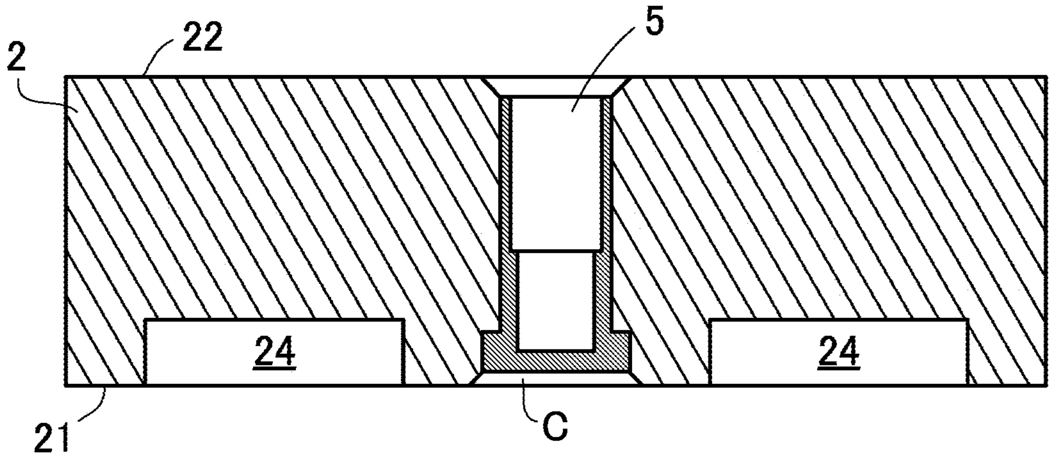
FIG. 8 is a descriptive drawing of the manufacturing method of an electrostatic chuck, showing a substrate with a bush inserted therethrough.

A bush insertion step is carried out in which the bush 5 is inserted into the through hole 23 of the substrate 2 (S2). As shown in FIG. 8, the bush 5 is inserted from the first surface 21 side, and is disposed so that the opening 511 is located on the side near the second surface 22 and the bottom plate 52 is located on the side near the first surface 21. When the bush 5 is pushed in until the flange 53 abuts against the boundary surface between the first portion and the second portion of the through hole 23, it is preferable that a small clearance C be formed between the bottom plate 52 of the bush 5 and the first surface 21.

Figure 9:
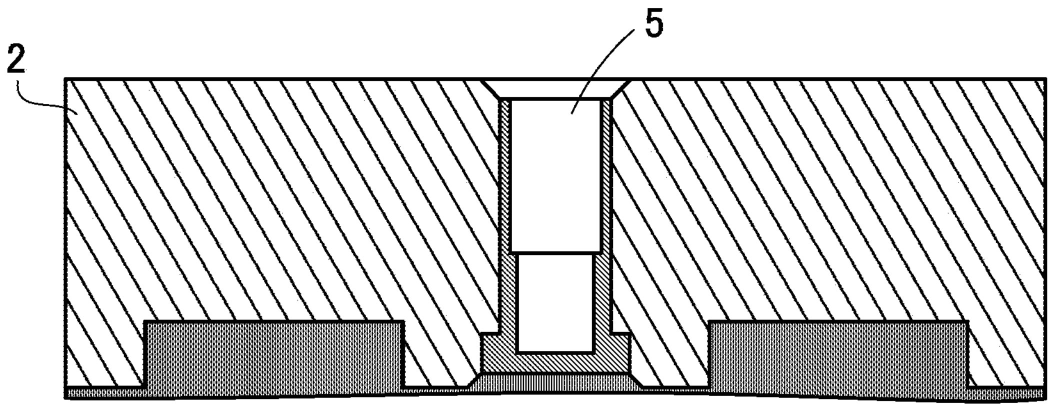
FIG. 9 is a descriptive drawing of the manufacturing method of an electrostatic chuck, showing the state after an electric conductor is thermal sprayed.
Figure 10:
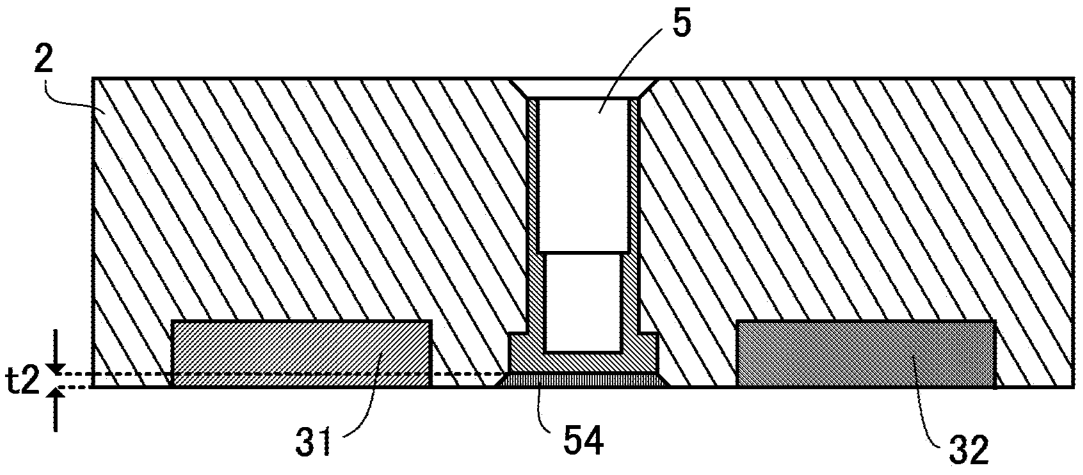
FIG. 10 is a descriptive drawing of the manufacturing method of an electrostatic chuck, showing the state after the electric conductor is ground.

After the bush 5 is inserted, as shown in FIG. 9, an electric conductor is thermal sprayed onto the entire surface of the side of the first surface 21 (S3). Next, the thermal sprayed electric conductor is ground and unwanted electric conductor is removed (S4). Specifically, grinding is performed until the substrate 2 is exposed in the portions other than the through hole 23 and the grooves 24. In this way, an attraction electrode forming step is carried out, and as shown in FIG. 10, the attraction electrode 3 including the positive electrode 31 and the negative electrode 32 and the filled layer 54 are formed on the first surface 21 of the substrate 2. In other words, the attraction electrode forming step of the embodiment includes a step of thermal spraying an electric conductor at least on the groove 24 and the clearance C, and a step of removing unwanted portions of the thermal sprayed electric conductor, forming the attraction electrode 3 in the groove 24, and forming the filled layer 54 in the clearance C.

In the embodiment, the attraction electrode 3 is formed by thermal spraying, but the method of forming the attraction electrode 3 is not limited thereto. For example, the attraction electrode 3 may be formed by printing. In addition, the attraction electrode 3 may also be formed by bonding an electric wire. Furthermore, when the substrate 2 is made of a fired ceramic body, an electric conductor may be disposed on the ceramic material before firing and then fired together to create a substrate 2 integrated with the attraction electrode 3.

Furthermore, when forming the attraction electrode 3 by thermal spraying, in the embodiment, an electric conductor is thermally sprayed on the entire surface, and unwanted portions are then removed by grinding. According to the method, this has the advantage that the gap between the electrodes can be easily made close to the design dimension, and the thickness of the electrodes is made approximately uniform, thereby suppressing variation in the attraction performance. However, the attraction electrode 3 may be formed by disposing a mask on which a desired electrode pattern is formed and thermal spraying an electric conductor onto the mask. In this case, the grooves 24 need not to be provided in the substrate 2.

When the entire surface is thermal sprayed with an electric conductor and then unwanted portions are removed by grinding, the bush 5 needs to be prevented from damaging by grinding. In the embodiment, the clearance C is provided between the bottom plate 52 of the bush 5 and the first surface 21 to prevent damage to the bush 5. Furthermore, the clearance C is filled with the thermal spray material to form the filled layer 54. The thermal spray material filled in the clearance C may be a material different from the electric conductor forming the attraction electrode 3, but it is preferable that both be the same material in terms of simplifying the manufacturing process. In other words, the filled layer 54 is preferably made of the same material as the attraction electrode. It is preferable that a thickness t2 of the filled layer 54 be as small as possible in order to bring the temperature measurement position and the workpiece W closer to each other. The thickness t2 of the filled layer 54 is, for example, about 0.1 mm or more and about 0.5 mm or less.

Figure 11:
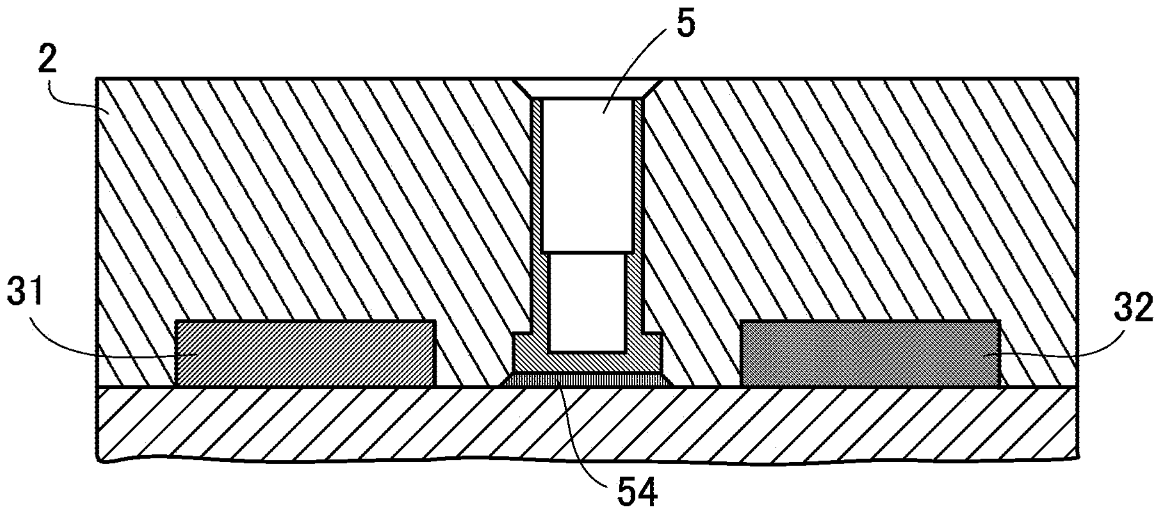
FIG. 11 is a descriptive drawing of the manufacturing method of an electrostatic chuck, showing the state after a dielectric is thermal sprayed.
Figure 12:
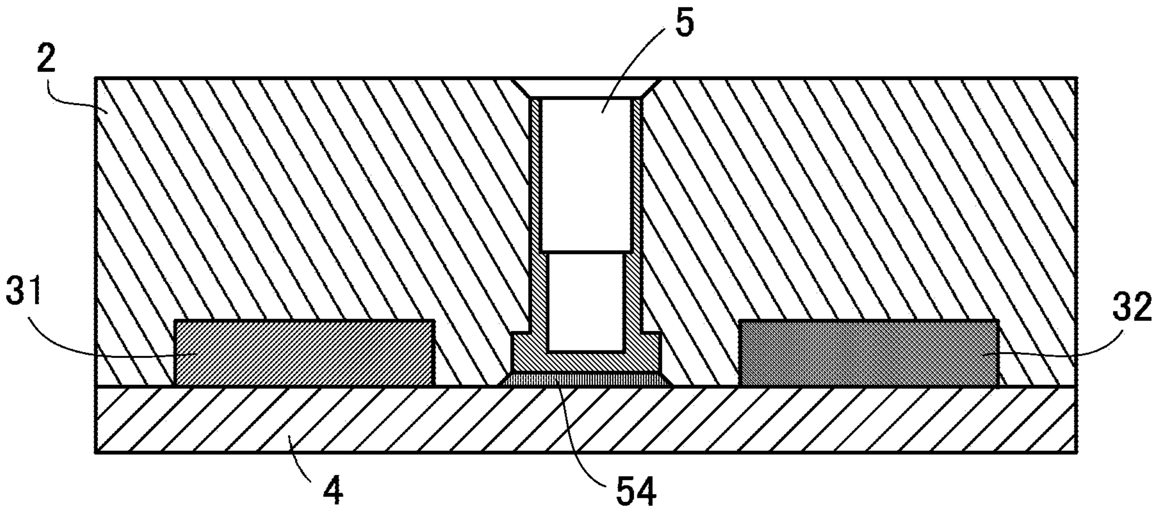
FIG. 12 is a descriptive drawing of the manufacturing method of an electrostatic chuck, showing the state after the dielectric is ground.

After the attraction electrode 3 is formed, as shown in FIG. 11, a dielectric is thermal sprayed onto the entire surface on the side of the first surface 21 (S5). The thermal sprayed dielectric is then ground to produce a smooth surface (S6). In this manner, the dielectric layer forming step is carried out, and the dielectric layer 4 is formed so as to cover the attraction electrode 3 and the bush 5, as shown in FIG. 11.

In the embodiment, the dielectric layer 4 is formed by thermal spraying, but the method of forming the dielectric layer 4 is not limited thereto. For example, the dielectric layer 4 may be formed by adhering a plate-like or film-like dielectric.

Then, a temperature adjuster installation step is carried out in which a temperature adjuster is installed (S7). When the heater electrode 611 constituting the heater 61 is provided, the heater electrode 611 may be formed by thermal spraying a resistive heating element onto the second surface 22 of the substrate 2. When forming the heater electrode 611 by thermal spraying, a groove is formed in the second surface 22, a resistive heating element is thermal sprayed onto the entire surface of the side of the second surface 22, and the heater electrode 611 may be formed by grinding the thermal sprayed resistive heating element to remove unwanted resistive heating element. Alternatively, the heater electrode 611 may be formed by disposing a mask on which a desired electrode pattern is formed, and thermal spraying a resistive heating element onto the mask.

The order of the steps in the manufacturing method described above may be changed within the scope of feasibility. For example, the formation of the heater electrode 611 may be performed at any time before the formation of the dielectric layer 4.

The disclosure is not limited to the configurations of the embodiments described above, and various modifications and applications can be made without departing from the technical spirit of the disclosure.

What is claimed is:

1. An electrostatic chuck, comprising:
- a substrate, comprising a first surface having electrical insulation properties and a second surface opposite to the first surface, and having a through hole formed therein that penetrates the first surface and the second surface;
- a bush, a bottomed cylindrical body comprising a side wall, an opening formed at one end of the side wall, and a bottom plate provided at the other end of the side wall, inserted through the through hole so that the opening is located on a side near the second surface and the bottom plate is located on a side near the first surface, and configured so that a temperature sensor for measuring a temperature of the bottom plate is capable of being attached thereto;
- an attraction electrode, formed on the first surface and made of an electric conductor;
- a dielectric layer, made of a dielectric, formed so as to cover the bush and the attraction electrode, and configured to be capable of attracting a workpiece; and
- a temperature adjuster, configured to be capable of adjusting a temperature of the workpiece.

2. The electrostatic chuck according to claim 1, wherein the bottom plate has a thickness of 3 mm or less.

3. The electrostatic chuck according to claim 1, wherein the bush further comprises a flange formed on a periphery of the bottom plate.

4. The electrostatic chuck according to claim 3, wherein the flange has a diameter of 8 mm or more and 10 mm or less.

5. The electrostatic chuck according to claim 1, further comprising a filled layer formed between the bottom plate and the dielectric layer.

6. The electrostatic chuck according to claim 5, wherein the filled layer has a thickness of 0.1 mm or more and 0.5 mm or less.

7. The electrostatic chuck according to claim 5, wherein the filled layer is made of the same material as the attraction electrode.

8. The electrostatic chuck according to claim 1, wherein the temperature adjuster comprises a heater.

9. The electrostatic chuck according to claim 8, wherein the second surface has electrical insulation properties, and the heater has a heater electrode formed on the second surface and made of a resistive heating element.

10. The electrostatic chuck according to claim 1, wherein the temperature adjuster comprises a cooler.

11. The electrostatic chuck according to claim 1, wherein the temperature sensor is a contact temperature sensor.

12. The electrostatic chuck according to claim 1, wherein the workpiece has thermal conductivity of 3.0 W/m·K or less.

13. The electrostatic chuck according to claim 1, wherein the substrate is made of ceramic or glass.

14. The electrostatic chuck according to claim 13, wherein the substrate is made of ceramic, and the bush is made of aluminum or aluminum alloy.

15. A manufacturing method of an electrostatic chuck, comprising:

a substrate preparation step of preparing a substrate comprising a first surface having electrical insulation properties and a second surface opposite to the first surface and having a through hole formed therein that penetrates the first surface and the second surface;

a bush insertion step of inserting a bush which is a bottomed cylindrical body comprising a side wall, an opening formed at one end of the side wall, and a bottom plate provided at the other end of the side wall, and is configured so that a temperature sensor for measuring a temperature of the bottom plate is capable of being attached thereto into the through hole so that the opening is located on a side near the second surface and the bottom plate is located on a side near the first surface;

an attraction electrode forming step of forming an attraction electrode made of an electric conductor on the first surface;

a dielectric layer forming step of forming a dielectric layer made of a dielectric configured to be capable of attracting a workpiece so as to cover the attraction electrode and the bush; and a temperature adjuster installation step of installing a temperature adjuster configured to be capable of adjusting a temperature of the workpiece.

16. The manufacturing method of an electrostatic chuck according to claim 15, wherein a groove is formed in the first surface, a clearance is formed between the bottom plate of the bush inserted into the through hole and the first surface, and the attraction electrode forming step comprises thermal spraying the electric conductor at least into the groove and the clearance, removing unwanted portions of the electric conductor thermal sprayed, forming the attraction electrode in the groove, and forming a filled layer in the clearance.

17. The manufacturing method of the electrostatic chuck according to claim 15, wherein the temperature sensor is a contact temperature sensor.

18. The manufacturing method of the electrostatic chuck according to claim 15, wherein the substrate is made of ceramic, and the bush is made of aluminum or aluminum alloy.

* * * * *